United States Patent
Reinhard et al.

(10) Patent No.: US 11,143,562 B2
(45) Date of Patent: Oct. 12, 2021

(54) DEVICE FOR DETECTING A PRESSURE OF A FLUID MEDIUM AND METHOD FOR MANUFACTURING THE DEVICE

(71) Applicant: Robert Bosch GmbH, Stuttgart (DE)

(72) Inventors: Markus Reinhard, Andernach (DE); Masoud Habibi, Schwieberdingen (DE); Winfried Kuhnt, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/576,436

(22) PCT Filed: Apr. 7, 2016

(86) PCT No.: PCT/EP2016/057585
§ 371 (c)(1),
(2) Date: Nov. 22, 2017

(87) PCT Pub. No.: WO2016/188662
PCT Pub. Date: Dec. 1, 2016

(65) Prior Publication Data
US 2018/0209865 A1    Jul. 26, 2018

(30) Foreign Application Priority Data

May 28, 2015  (DE) ...................... 10 2015 209 830.3
Feb. 8, 2016   (DE) ...................... 10 2016 201 847.7

(51) Int. Cl.
*G01L 13/02*    (2006.01)
*G01L 19/14*    (2006.01)

(52) U.S. Cl.
CPC .......... *G01L 13/025* (2013.01); *G01L 19/143* (2013.01); *G01L 19/147* (2013.01);
(Continued)

(58) Field of Classification Search
CPC .................................................. G01L 13/025
See application file for complete search history.

(56) References Cited

U.S. PATENT DOCUMENTS 5,747,694 A      5/1998  Baba et al.
2003/0199779 A1* 10/2003 Muhlenberg ........... A61B 5/029
                                                        600/513
(Continued)

FOREIGN PATENT DOCUMENTS

CN      102401715 A     4/2012
CN      102539060 A     7/2012
(Continued)

OTHER PUBLICATIONS

International Search Report dated Mar. 27, 2017, of the corresponding International Application PCT/EP2016/057585 filed Apr. 7, 2016.

(Continued)

*Primary Examiner* — Lisa M Caputo
*Assistant Examiner* — Alex T Devito
(74) *Attorney, Agent, or Firm* — Norton Rose Fulbright US LLP; Gerard Messina

(57) ABSTRACT

A device for detecting a pressure of a fluid medium is described. The device includes at least one housing having at least two pressure feeds; at least one sensor module, the sensor module being accommodated in the housing, the sensor module including at least one support element, the support element including at least one substrate and at least one molding compound, the support element further including at least one passage opening, the passage opening entirely penetrating the support element; at least one pressure sensor element for detecting the pressure, the pressure sensor element including at least one diaphragm, the pressure sensor element covering the passage opening; at least one control and evaluation unit, the control and evaluation unit being at least partially enclosed by the molding compound. A method for manufacturing the device is also described.

8 Claims, 6 Drawing Sheets

(52) U.S. Cl.
CPC .. *G01L 19/148* (2013.01); *H01L 2224/48091* (2013.01); *H01L 2224/48472* (2013.01); *H01L 2224/73265* (2013.01); *H01L 2224/8592* (2013.01)

(56) References Cited

U.S. PATENT DOCUMENTS

2011/0048137 A1    3/2011   Reinmuth et al.
2014/0033824 A1    2/2014   Habibi et al.

FOREIGN PATENT DOCUMENTS

| | | |
|---|---|---|
| CN | 103776580 A | 5/2014 |
| CN | 106461485 A | 2/2017 |
| DE | 102007016475 A1 | 10/2008 |
| DE | 102008005153 A1 | 7/2009 |
| DE | 102011005933 A1 | 9/2012 |
| DE | 102011085652 A1 | 5/2013 |
| EP | 1505380 A2 | 2/2005 |
| EP | 1521952 B1 | 8/2010 |

OTHER PUBLICATIONS

Robert Bosch GmbH: Sensoren im Kraftfahrzeug [Motor vehicle sensors], 1st edition 2010, pp. 80-82.

\* cited by examiner

DEVICE FOR DETECTING A PRESSURE OF A FLUID MEDIUM AND METHOD FOR MANUFACTURING THE DEVICE

FIELD

The present invention relates to a device for detecting a pressure of a fluid medium and to a method for manufacturing the device. Such devices are employed, for example, in automotive engineering, for example, in particle filters, in particular, in diesel particle filters, or for particle filters in engine control systems having particle filters, as well as in low pressure exhaust gas recirculation. The present invention is also possible in other fields of application.

BACKGROUND INFORMATION

Numerous conventional devices for detecting a pressure of a fluid medium are available. A pressure measuring module for detecting an absolute pressure or a relative pressure is described in German Patent Application No. DE 10 2008 005153 A1. The pressure measuring module includes a housing preferably manufactured as a pre-mold, in which a pressure measuring chip is accommodated. The chip is electrically contacted either with a stamped grid or with at least one strip conductor, at least one electronic component being provided, which is connected to a section of the stamped grid or to the at least one strip conductor protruding laterally from the housing manufactured preferably as a pre-mold, and which is covered by a partition of a cover.

A device for measuring pressure is described in European Patent No. EP 1 521 952 B1, which includes a housing, in which a support provided with a sensor element and with electrical connection elements is situated. The housing includes a housing space surrounding the sensor element and connected to a first pressure channel of a first pressure connection and a second housing space sealed off from the first housing space, surrounding at least the electrical connection elements. The housing includes a third housing space sealed off from the first housing space and from the second housing space, which is connected to a second pressure channel of a second pressure connection.

A device for detecting a pressure of a fluid medium is described in German Patent Application No. DE 10 2011 085652 A1. The device includes at least one housing having at least one pressure chamber. At least one pressure sensor element is accommodated in the pressure chamber. The device further includes at least one compensating element between the housing and the pressure sensor element for compensating for the thermo-mechanical tensions. The pressure sensor element is connected at least partially to the compensating element. The compensating element includes at least one first opening. The pressure sensor element may be acted upon by a first pressure via the first opening. The compensating element further includes at least one second opening. The pressure chamber and the pressure sensor element may be acted upon by at least one second pressure via the second opening.

However, conventional devices for detecting a pressure of a fluid medium present several technical challenges. The devices normally include a circuit carrier, which has a ceramic substrate. Such a design may, in principle, result in a high space requirement. This may be associated, in particular, with high manufacturing costs.

SUMMARY

A device for detecting a pressure of a fluid medium and a method for manufacturing the device are provided, which may at least largely avoid the aforementioned problems of conventional devices and methods.

The term "pressure" refers, in particular, to a partial pressure and/or to an absolute pressure and/or to a differential pressure and/or to a pressure profile and/or to a pressure development, for example, over time. The pressure may be multiple pressures, for example, a difference of multiple pressures, for example. Thus, the device may be, in particular, a differential pressure measuring device, i.e., a device which is configured to detect a difference between a first pressure $p_1$, for example, in a first pressure chamber, and a second pressure $p_2$, for example, in a second pressure chamber. One of these pressure chambers may, for example, be a reference pressure chamber, for example, a chamber having atmospheric pressure. Other embodiments are also possible, however.

A "fluid medium" within the context of the present invention is understood, in principle, to mean an arbitrary substance in the fluid, in particular, gaseous state. It may be a substance, for example, which offers no resistance to an arbitrarily slow shearing. In general, the fluid state may be a function of temperature and/or pressure. The fluid medium may be present as a pure substance or as a mixture of substances.

The device for detecting a pressure of a fluid medium includes at least one housing having at least two pressure feeds and at least one sensor module. The sensor module is accommodated in the housing. The sensor module includes at least one support element, at least one pressure sensor element for detecting the pressure and at least one control and evaluation unit. The support element includes at least one substrate and at least one molding compound. The support element further includes at least one passage opening, which entirely penetrates the support element. The pressure sensor element includes at least one diaphragm. The pressure sensor element covers the passage opening. The control and evaluation unit is at least partially enclosed by the molding compound.

The term "housing" within the context of the present invention relates, in principle, to an arbitrarily shaped element, which is configured to partially or completely enclose components of the device and to further protect these components from external influences, such as mechanical load or moisture. The housing may include at least one first housing part, in particular, a housing base, and at least one second housing part, in particular, a housing cover. The first housing part and the second housing part may be integrally joined to one another.

The designations "first" and "second" housing part are to be considered purely as designations with no indication of an order of priority and, for example, without precluding the possibility that multiple types of first housing parts and multiple types of second housing parts or, in each case, exactly one type may be provided. Additional housing parts, for example, third housing parts, may also be present.

The device may further include at least one sealing material. The sealing material may be configured to connect the first housing part and the second housing part to one another. The sealing material may further be configured to connect the sensor module to the housing. The sealing material may include at least one material, which is selected from the group made up of: an adhesive, an adhesive film, a press fit with an elastomer.

The term "adhesive" refers, in principle, to a process material, which is configured, in particular, to integrally and, preferably irreversibly join components to one another. The adhesive may preferably be configured to be applied to the corresponding components in a liquid state or viscous state, and to subsequently change into a solid state as a result of a physical setting process and/or as a result of a chemical hardening process. The term "adhesive film" refers, in principle, to a film, which includes an adhesive. The film may, for example, be manufactured from a plastic material.

The housing may include at least one receptacle for accommodating the sensor module. The receptacle may be, in particular, a recess. The sensor module may be affixed in the receptacle with the aid of the sealing material. The housing may enclose at least one pressure chamber and at least one circuit space. The pressure chamber may be sealed off from the circuit space. At least one electronic component may be accommodated in the circuit space. The sensor module may be situated partially in the pressure chamber and partially in the circuit space and may be sealed off from the housing.

"Pressure chamber" may be, in principle, an arbitrary space, which preferably includes no electronic components and is at least partially closed off, in particular, from the surroundings. The pressure chamber may be, in particular, a space, in which at least one pressure of the fluid medium prevails, which is detected by the device.

The term "circuit space" refers, in principle, to an arbitrary space, which is at least partially closed off, in particular, from the surroundings, and in which at least one electronic component may be accommodated. The electronic components of the circuit space may, in particular, be designed to apply at least one electrical current and/or at least one voltage to the pressure sensor element.

The housing includes at least two pressure feeds. These may be, for example, a first pressure feed and a second pressure feed. The terms "first" and "second" pressure feed are again to be considered purely as designations with no indication of an order of priority, without precluding the possibility that multiple types of first pressure feeds and multiple types of second pressure feeds or, in each case, exactly one type may be provided. Additional pressure feeds, for example, third pressure feeds, may also be present in the device.

The first pressure feed may be acted upon by a first pressure. A first pressure may be understood, in principle, to be an arbitrary pressure of the fluid medium, in principle, also an external pressure or a reference pressure, for example, the pressure of an ambient air below the first pressure. The pressure sensor element may be preferably connected via the first pressure feed to the fluid medium which exhibits the first pressure in such a way that the first pressure may be detected by the pressure sensor element.

The pressure sensor element may be acted upon by at least one second pressure via the second pressure feed. The second pressure may be defined, in principle, like the first pressure. The second pressure may preferably differ from the first pressure, but may also coincide with the first pressure, for example, also for carrying out a calibration and/or a compensation.

The support element includes at least one substrate and at least one molding compound. The substrate may include at least one circuit carrier. The term "circuit carrier" refers, in principle to an arbitrary element which may be designed to carry and/or to include at least one control and/or at least one evaluation circuit, for example, an electrical and/or electronic circuit. The circuit carrier may, for example, be a ceramic circuit carrier. The circuit carrier may, for example, be designed partially or entirely as a circuit board or at least include a circuit board. Other designs are, in principle, also possible.

The term "molding compound" refers, in principle, to an arbitrary material, which may be subjected in an initial state to a shaping process in a mold or in a tool. It may be, in particular, a curable material or material mixture, which may be shaped in an initial state, in order to then cure and to remain dimensionally stable. The molding compound may include, in particular, a plastic or a plastic mixture or also at least a starting material for a plastic.

For example, the molding compound may include at least one flow resin and/or one synthetic resin. Other materials are also possible. The molding compound may be configured to at least partially enclose the substrate, together with the components. The molding compound may be configured to protect the components from adverse effects resulting from mechanical damage, contamination or the like. The molding compound may be designed in such a way that at least part of the diaphragm is not covered by the molding compound.

The support element further includes at least one passage opening, which penetrates the entire support element. A "passage opening" may be understood to mean, in particular, an opening, which connects to an additional opening and/or an open space and/or is at least fluidically connected on at least two sides. The passage opening may be or may include a through bore, for example. The passage opening may include at least one recess of the molding compound and at least one hole of the substrate. The hole may, in principle, have an arbitrary cross section, for example, a round cross section, an oval cross section or a polygonal cross section. Other cross sections are, in principle, also possible. The passage opening may further include at least one channel, which is delimited by the molding compound. A "channel" is understood to mean, in particular, an elongated cavity, which extends from at least one first opening to at least one second opening. The channel may, in principle, have an arbitrary cross section, for example, a round cross section, an oval cross section or a polygonal cross section.

The term "pressure sensor element" refers, in principle, to an arbitrary sensor element, which is configured to detect at least one pressure of a fluid medium. The pressure sensor element may be, in particular, a chip. The pressure sensor element may, for example, be a pressure sensor, as is described in Robert Bosch GmbH: Sensoren im Kraftfahrzeug (Motor vehicle sensors), 1st edition 2010, pages 80-82. The pressure sensor element may preferably be a diaphragm sensor, which may include, in particular, a thin diaphragm as a mechanical intermediate stage, which is exposed, for example, on one side to the pressure of the fluid medium and which deflects more or less under this influence. Other pressure sensor elements may, in principle, also be used alternatively or in addition, for example, on pressure sensor elements based on a piezo effect and/or on pressure sensor elements based on a strain of at least one strain-resistant electrical resistance.

A "diaphragm" is understood within the context of the present invention to mean, in principle, an arbitrary element having an elongated shape and a thickness, an extension of the element in the lateral dimension exceeding the thickness of the element, for example, by a factor of 20, preferably by a factor of 50 or preferably by a factor of 100. The diaphragm may be manufactured entirely or partially from a flexible material or entirely or partially from a rigid material. In addition, the diaphragm may be variously permeable to different substances. The diaphragm may, for example, be at least largely impermeable to at least one or multiple substances. The diaphragm may, for example, be permeable to at least one or multiple substances in one direction. The diaphragm may, for example, be permeable to at least one or multiple substances in both directions. Other specific embodiments are, of course, also possible.

The pressure sensor element may also be entirely or partially covered with a first protective material. The first protective material may be configured to provide a protection of a pressure sensor element from external influences. The first protective material may, for example, include a gel and/or another deformable compound of a plastic or flowable material.

The term "control and evaluation unit" refers within the context of the present invention to an electrical and/or electronic circuit, which is configured to detect and/or adjust at least one signal, in particular, an electrical signal. The control and evaluation unit may, for example, include at least one application-specific integrated circuit and/or at least one capacitor. Other embodiments are, in principle, also possible.

The substrate of the support element may include strip conductors. The term "strip conductors" refers, in principal, to electrically conductive connections having a two-dimensional profile, for example, in a plane of the substrate. Strip conductors may be used for connecting electrical components. The strip conductors may, for example, be manufactured from gold. Other materials are, in principle, also possible. The sensor element and the control and evaluation unit may be connected to the strip conductors. The sensor element and/or the control and evaluation unit may include, in particular, bond pads, which are electrically connected to bonding surfaces of the strip conductors.

The bonding surfaces of the strip conductors may be covered at least partially by a second protective material. The second protective material may be configured to provide a protection of the bonding surfaces from external influences. The second protective material may include, for example a resin, in particular, an epoxy resin.

The terms "first" and "second" protective material are again to be considered purely as designations with no indication of an order of priority and, for example, without precluding the possibility that multiple types of first protective materials and multiple types of second protective materials or, in each case, exactly one type may be provided. Additional protective materials, for example, third protective materials, may also be present.

The device may further include at least one electrical connector, in particular, at least one plug. The sensor module may be electrically connected to the electrical connector. The sensor module may be connected, in particular, via at least one contact to the electrical connector. The contact may include, in particular, an electrically conductive adhesive.

A method for manufacturing the device is also described. The method may include the method steps described below. The method steps may be carried out, for example, in the predefined sequence. Another sequence is also possible, however. In addition, one or multiple method steps may be carried out simultaneously or chronologically overlapping. In addition, one or multiple or all of the method steps may be carried out once or also repeatedly. Moreover, the method may also include yet additional method steps.

The method for manufacturing the device according to the present invention, as according to one of the specific embodiments, which was discussed previously above or is discussed below, includes the following steps:
a) providing a first housing part of a housing;
b) introducing the sensor module into the housing part; and
c) attaching a second housing part of the housing.

Step b) may include a form-locking connection of the sensor module to the first housing part, in particular, a gluing of the sensor module into the first housing part. Step b) may further include an introduction of at least one sealing material between the first housing part and the sensor module. The sensor module may be introduced as a single piece into the first housing part.

Step b) may further include an establishment of an electrical connection between the sensor module and at least one electrical connector of the device. The electrical connection may be established with the aid of at least one electrically conductive adhesive.

Step c) may include an introduction of at least one sealing material between the sensor module and the first housing part.

The described device for detecting a pressure of a fluid medium as well as the method for manufacturing the device has numerous advantages over conventional devices and methods. Use of the support element, which includes the substrate and the molding compound, may result, in particular, in a significant potential savings compared to a ceramic support, since a space requirement may, for example, be reduced by approximately half. The sensor module may, in particular, have a technical advantage, since the application-specific integrated circuit and the capacitors are injected into the molding compound and are thus protected from media. In particular, it may only be necessary to mount the pressure sensor element just once on the passage opening of the support element. The pressure sensor element may, in particular, be a chip having a diaphragm and having gold bond pads, which may, in particular, be easily protected from aggressive media.

When introducing the sensor module into the housing, in particular, into the first housing part, the sensor module may be simultaneously installed and contacted in the housing with the aid of the sealing material, in particular, with the aid of the sealing adhesive and/or of the conductive adhesive. Due to the fact that the sealing materials may have a similar temperature expansion coefficient, it is possible to avoid mechanical stresses that could impact the sensor module. If at least one conductive adhesive is used for introducing the sensor module into the housing, then a direct electrical contact may be established by the conductive adhesive, for example, in an adhesive and joining surface. A direct electrical contact having at least one electrical connection, which is described in greater detail below, may, for example be established with the aid of the at least one conductive adhesive.

The same sealing material, in particular, the same sealing adhesive used for the gluing of the sensor module, may be used for attaching the second housing part and may be guided in a figure-eight transversely across the module, so that as a result two separate chambers may be formed. The described design of the device may result, in particular, in a particularly good cost advantage.

The sensor module having the gold bond pads, in particular, media-resistant gold bond pads, may be glued onto the channel formed by the molding compound within the recess of the molding compound and may be connected by the bonding wires, in particular, by the gold bonding wires to the strip conductors on the circuit board. The bonding surfaces on the circuit board exposed for such purpose and the bond pads may be protected after a bonding process by the second protective material, in particular, by a diffusion-resistant epoxy resin compound. The bonding wires and the pressure sensor element may be covered in the recess by the first protective material, in particular, by a pressure-transmitting gel. The application-specific integrated circuit may be configured for signal evaluation and may be entirely or at least partially embedded with the bonding wires in the molding compound and may be protected from a measuring medium, for example, waste gas. The capacitors may also be embedded in the molding compound.

Since contact surfaces of the sensor module, once they have been introduced into the first housing part, in general may not be accessible from above, they may not, in principle, be connected to plug contacts of the housing using conventional methods such as, for example, soldering or wire bonding. Instead, the sealing material and the electrical connector may be simultaneously manufactured in one work step using a conductive adhesive or a conductive adhesive film.

As a result, the method for manufacturing the device may, in principle, be simplified significantly. Previously, an adhesion of the sensor module was, in principle, initially cured in order to enable the subsequent bonding process. Within the scope of the method according to the present invention, the sealing material for a sealing of the housing and the conductive adhesive may initially be applied successively, then the sensor module placed and then the sealing material for a sealing of the second housing part applied. All sealing materials and/or conductive adhesives may be jointly cured.

BRIEF DESCRIPTION OF THE DRAWINGS

Additional optional details and features of the present invention result from the following description of preferred exemplary embodiments, which are schematically depicted in the figures.

DETAILED DESCRIPTION OF EXAMPLE EMBODIMENTS

Figure 1A:
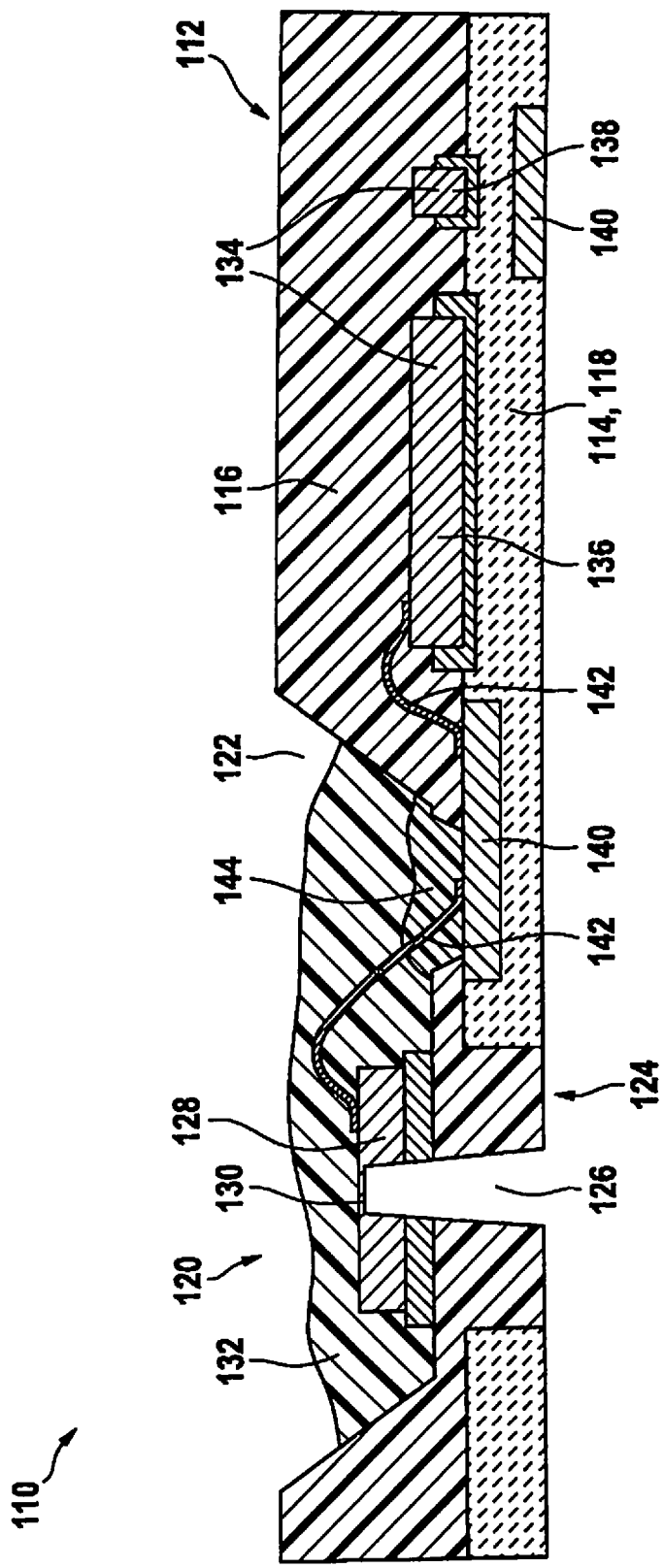
FIGS. 1A and 1B show a sectional depiction of one exemplary embodiment of a sensor module insertable into a device according to the present invention (FIG. 1A) and a depiction of a circuit diagram of a sensor module (FIG. 1B) insertable into a device according to the present invention (FIG. 1B).
Figure 1B:
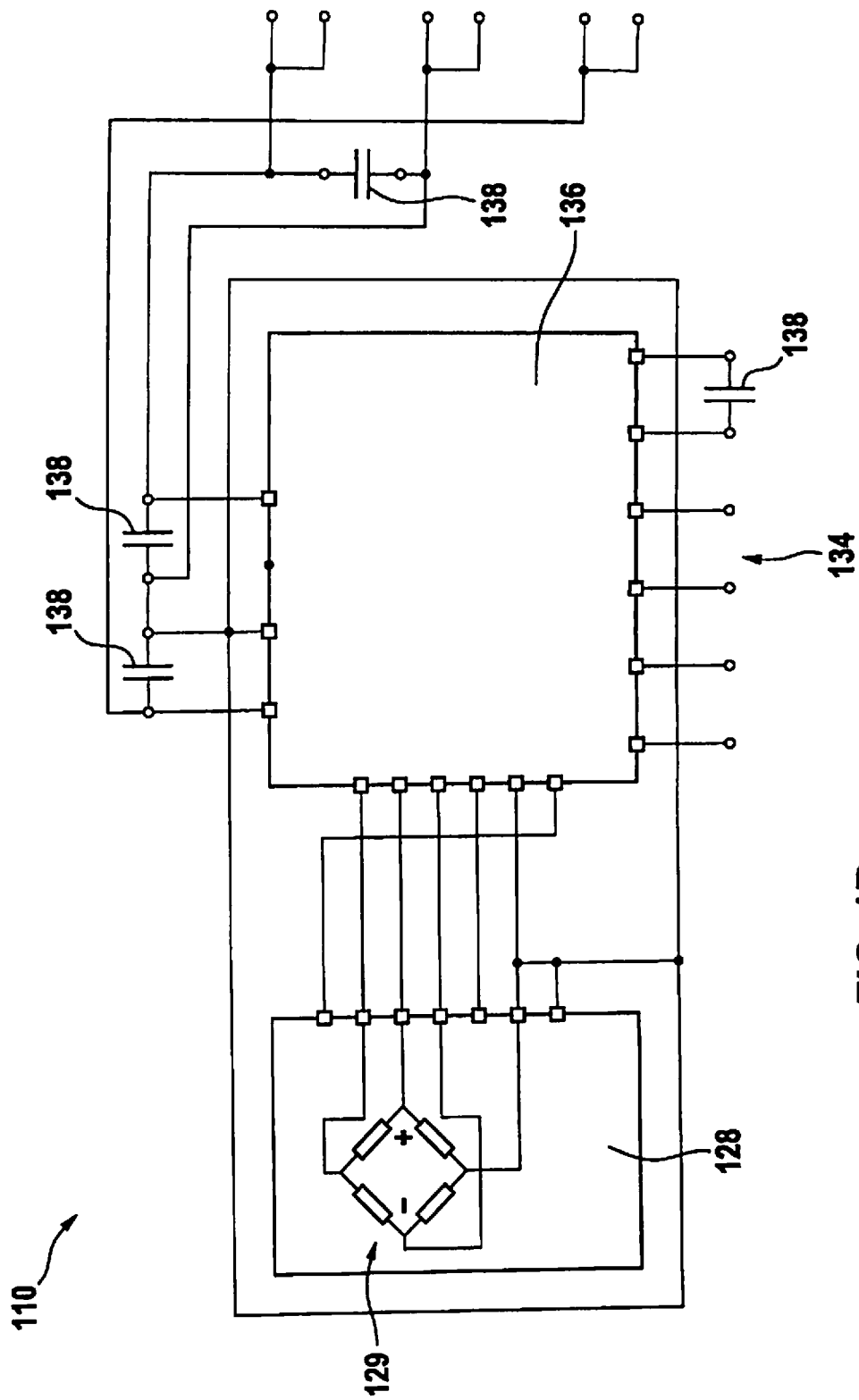

FIG. 1A shows an illustrative exemplary embodiment of a sensor module 110. Sensor module 110 is shown in FIG. 1A in a sectional depiction. FIG. 1B shows an exemplary circuit diagram of sensor module 110.

The sensor module 110 includes at least one support element 112, which includes at least one substrate 114 and at least one molding compound 116. Molding compound 116 is present preferably in a cured state during use of the sensor module 110. Substrate 114 may include a circuit board 118, for example. Substrate 114 may further have a cuboid or plate-like basic shape. A film form is also possible. Substrate 114 may, for example, be manufactured entirely or partially from a ceramic material. Other materials are, in principle, also possible, for example, a glass fiber-reinforced plastic material and/or a polyimide.

Molding compound 116 may, for example, include a flow resin or a synthetic resin and may be configured to at least partially enclose substrate 114.

Support element 112 further includes at least one passage opening 120, which entirely penetrates the support element 112. Passage opening 120 of support element 112 may include at least one recess 122 of the molding compound and at least one opening 124 of substrate 114. The passage opening may further include at least one channel 126, which is delimited by molding compound 116.

Sensor module 110 further includes at least one pressure sensor element 128 for detecting the pressure. Pressure sensor element 128 includes at least one diaphragm 130. Pressure sensor element 128 covers passage opening 120. Pressure sensor element 128 may be entirely or partially covered with a first protective material 132. First protective material 132 may be configured to provide a protection of pressure sensor element 128 from external influences. First protective material 132 may include, in particular, a gel.

Sensor module 110 may also include at least one control and evaluation unit 134. Control and evaluation unit 134 may be configured to detect and/or adjust at least one signal. Control and evaluation unit 134 is at least partially enclosed by molding compound 116. Control and evaluation unit 134 may include, in particular, at least one application-specific integrated circuit 136 (ASIC) and/or at least one capacitor 138.

Substrate 114 may include strip conductors 140. Strip conductors 140 may be manufactured from gold. Pressure sensor element 128 and control and evaluation unit 134 may be connected to strip conductors 140. Pressure sensor element 128 and control and evaluation unit 134 may include bond pads, for example, which are electrically connected by bonding wires 142 to bonding surfaces of strip conductors 140.

The bonding surfaces of strip conductors 140 may be at least partially covered by a second protective material 144. Second protective material 144 may be configured to provide a protection of the bonding surfaces from external influences. Second protective material 144 may include, in particular, a resin, in particular, an epoxy resin.

FIG. 1B shows an exemplary circuit diagram of sensor module 110. Sensor module 110 may, for example, correspond to sensor module 110 described in FIG. 1B, so that reference may be made largely to the above description. Sensor module 110 includes at least one pressure sensor element 128 and at least one control and evaluation unit 134. As indicated in FIG. 1B, the pressure sensor element may be based, for example on at least one pressure or strain-dependent electrical resistance influenceable by the pressure, which is evaluated, for example, with the aid of at least one bridge circuit 129, in order to generate or to detect a pressure signal. Control and evaluation unit 134 may, as stated above, include at least one application-specific integrated circuit 136 and, for example, at least four capacitors 138. It is noted that within the scope of the present invention, other pressure measuring principles and, accordingly, also other types of pressure sensor elements 128 and/or control and evaluation units 134 may, in principle, also be employed. One or multiple pressure sensor elements 128 may be connected to one or multiple application-specific integrated circuits (ASIC) 136. Alternatively or in addition, sensor module 110 may further include a temperature sensor element, for example, an NTC resistor.

Figure 2:
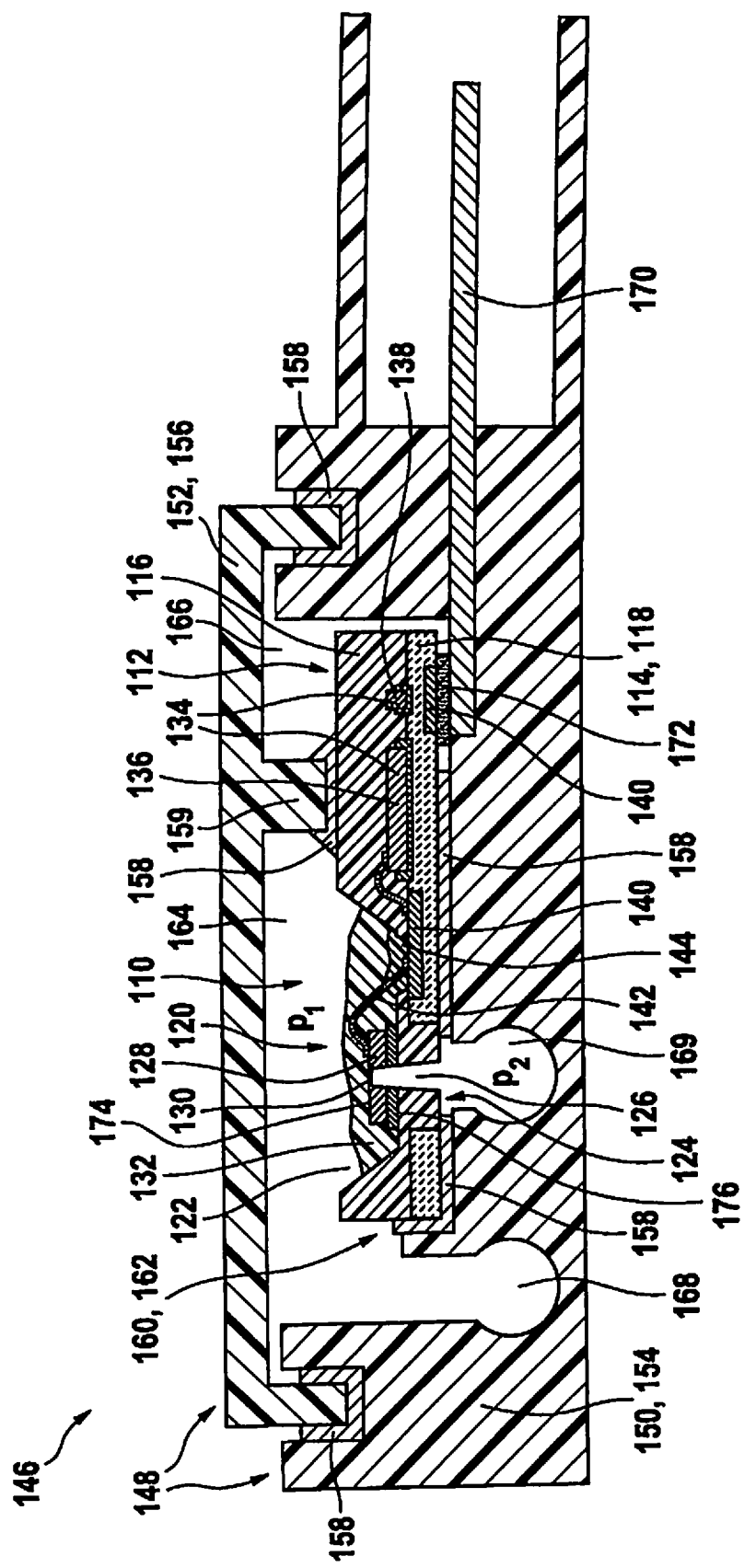
FIG. 2 shows a depiction of one exemplary embodiment of a device according to the present invention for detecting a pressure of a fluid medium.

FIG. 2 shows an illustrative exemplary embodiment of a device 146 according to the present invention for detecting a pressure of a fluid medium. Device 146 is shown in FIG.

2 in a sectional depiction. Device 146 includes at least one sensor module 110. Sensor module 110 corresponds to the arrangement according to FIG. 1A, so that reference may be made largely to the description of FIG. 1A above.

Device 146 includes at least one housing 148. Housing 148 may include at least one first housing part 150 and at least one second housing part 152. First housing part 150 may, in particular, be a housing base 154. Second housing part 152 may also be, in particular, a housing cover 156. First housing part 150 and second housing part 152 may be integrally joined to one another. Device 146 may include at least one sealing material 158. Sealing material 158 may be configured, in particular, to connect first housing part 150 and second housing part 152 to one another. Sealing material 158 may also be configured to connect sensor module 110 to housing 148.

Housing 148 may include at least one receptacle 160 for accommodating sensor module 110. Receptacle 116 may, in particular, be a recess 162. Sensor module 110 may be affixed in receptacle 160 with the aid of sealing material 158. In order to electrically contact the at least one strip conductor 140 when inserting sensor module 110 into first housing part 150, for example, into receptacle 160 and, for example, to electrically connect to at least one electrical connector 170, sealing material 158 may entirely or partially include electrically conductive properties and/or may be supplemented by at least one electrically conductive adhesive 172, as indicated in FIG. 2. This electrically conductive adhesive may, for example, be entirely or partially designed as an electrically conductive adhesive compound and/or as an electrically conductive adhesive film.

Housing 148 may enclose at least one pressure chamber 164 and at least one circuit space 166. Pressure chamber 164 may be sealed off from circuit space 166, for example by sealing material 158 and/or by at least one web 159 which, originating from housing cover 156, is placed on sensor module 110, for example, and is sealed off against sensor module 110 by sealing material 158. Thus, sensor module 110 may be additionally mechanically fixed with the aid of this web 159. At least one electrical component may be accommodated in circuit space 166. Sensor module 110 may be situated partially in pressure chamber 164 and partially in circuit space 166 and may be sealed off from housing 148. In the example depicted, for example, the at least one capacitor 138 may be situated in circuit space 166.

Housing 148 further includes at least two pressure feeds 168, 169. Thus, for example, a first pressure feed 168 may be connected to pressure chamber 164 and a second pressure feed 169 may be connected to channel 126. Thus, pressure sensor element 128 may be acted upon by a first pressure $p_1$ from upper side 174 via first pressure feed 168 and by a second pressure $p_2$ from underside 176 via second pressure feed 169. Pressure sensor element 128 may thus be deformed, for example, corresponding to difference $p_1-p_2$, the deformation being electrically detectable.

Figure 3:
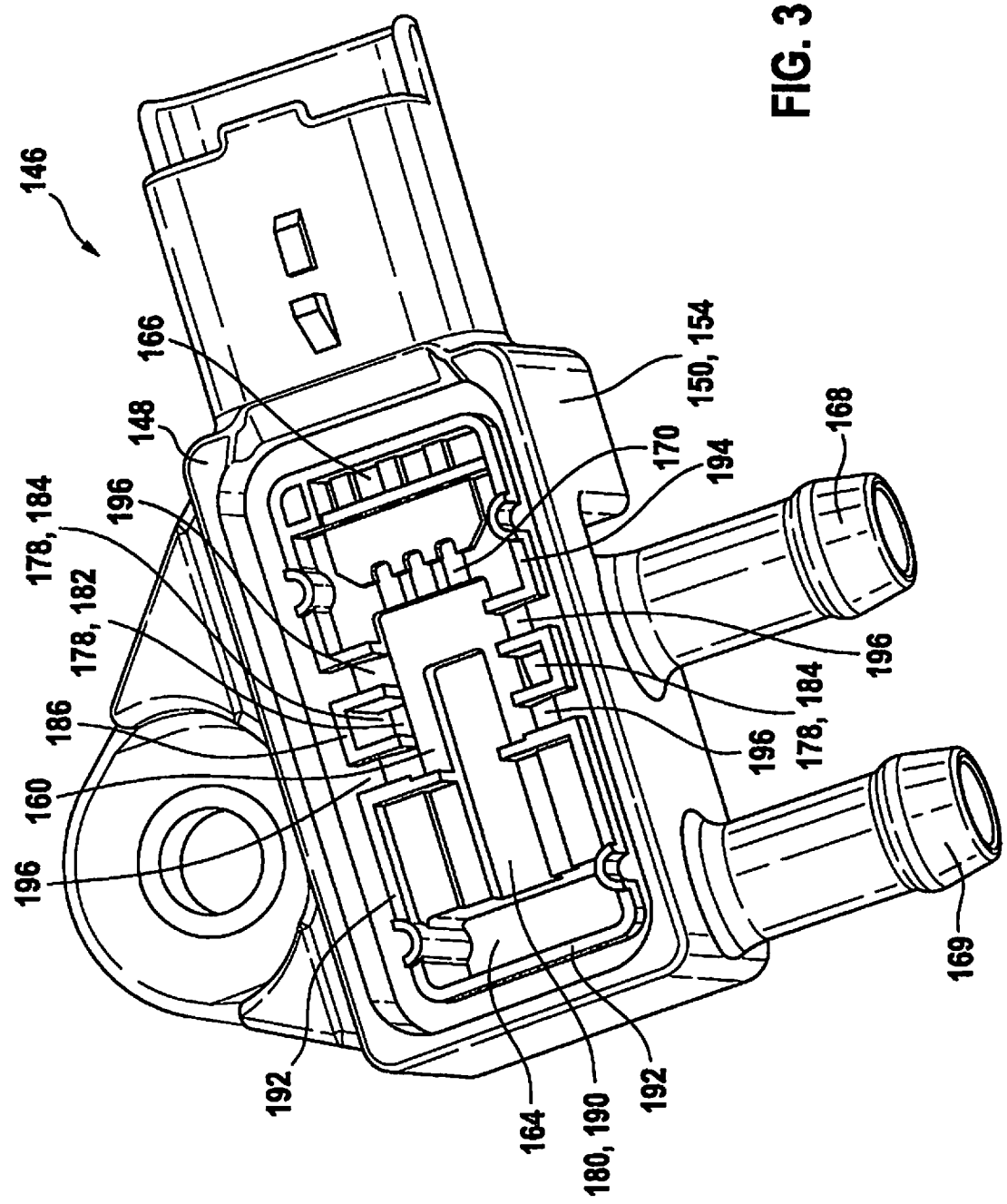
FIG. 3 shows a top view of another exemplary embodiment with no second housing part and with no pressure sensor module.
Figure 4:
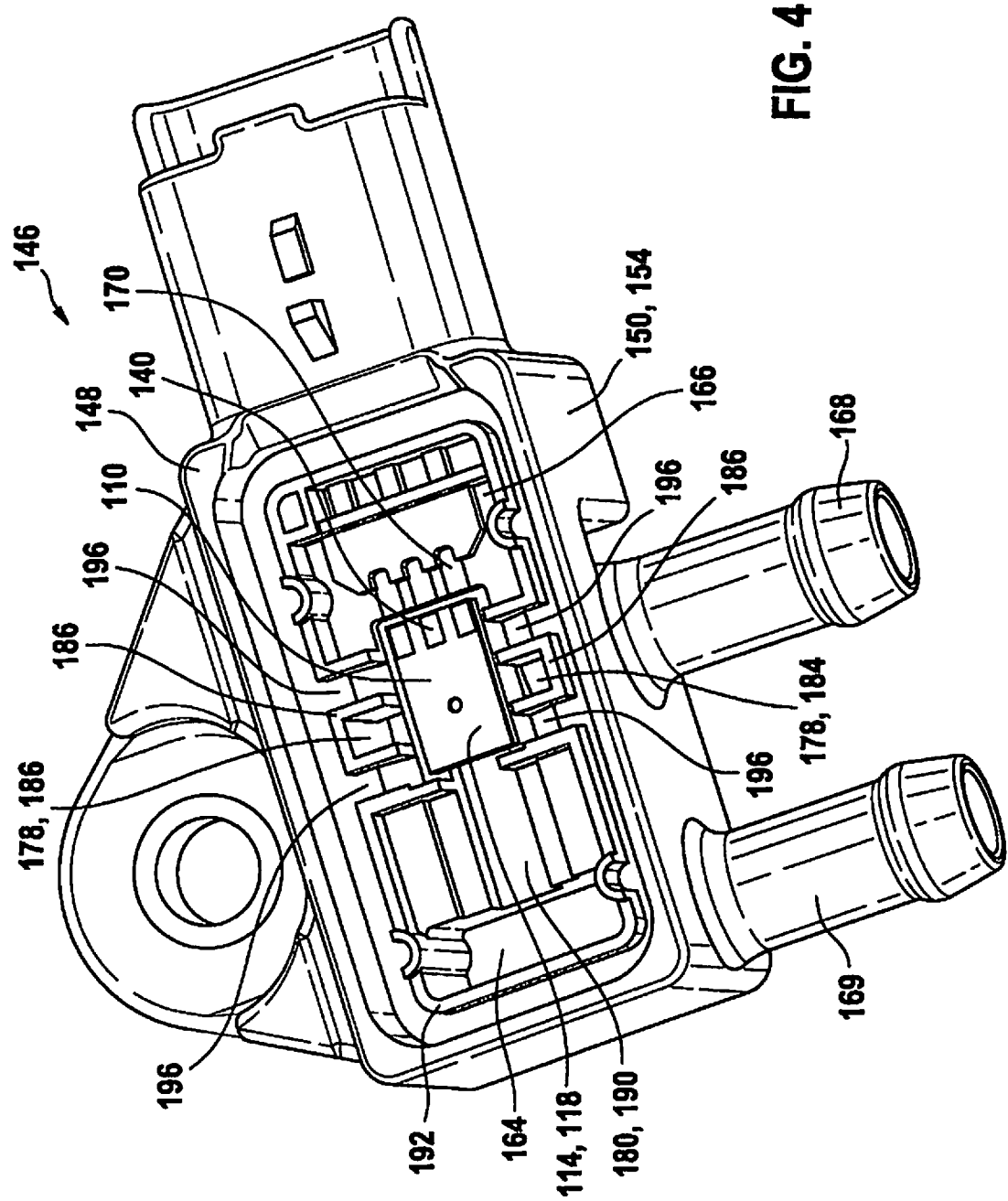
FIG. 4 shows a top view of the other exemplary embodiment with no second housing part and with the pressure sensor module.
Figure 5:
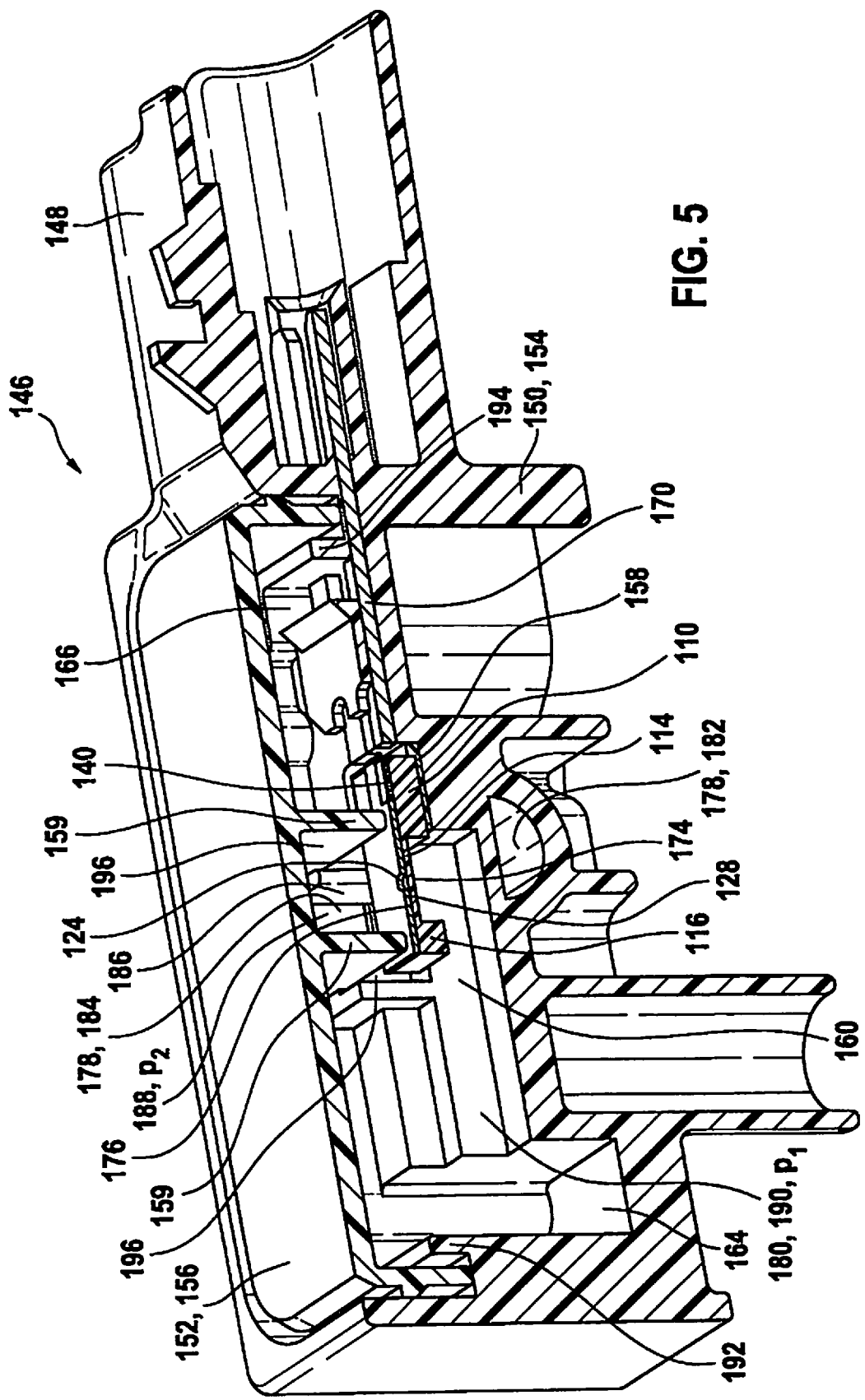
FIG. 5 shows a sectional view of the additional exemplary embodiment.

FIGS. 3, 4 and 5 show another exemplary embodiment of a device 146 according to the present invention for detecting a pressure of a fluid medium. Only the differences from the preceding exemplary embodiments are described below and identical components are provided with identical reference numerals. FIG. 3 shows a top view of device 146 without second housing part 152 or housing cover 156 and without sensor module 110. FIG. 4 shows a top view of device 146 without second housing part 152 or housing cover 156 and with sensor module 110. FIG. 5 shows a sectional view of device 146.

Compared to the preceding exemplary embodiments, sensor module 110 is situated inverted in housing 148, as described in greater detail below. In this case, pressure sensor module 110 is connected to first housing part 150 with the aid of sealing material 158. More precisely, sealing material 158 is connected to molding compound 116 and to first housing part 150. As previously described, pressure sensor element 128 includes an upper side 174 and an underside 176. Diaphragm 130 in this case is located on upper side 174. Underside 176 faces substrate 114. As is readily apparent in FIG. 3, a first pressure channel 178 and a second pressure channel 180 are formed in first housing part 150 and housing base 154. First pressure channel 178 is connected to first pressure feed 168 and second pressure channel 180 is connected to second pressure feed 169.

As is readily apparent in FIGS. 4 and 5, pressure sensor module 110 is accommodated in housing 148 in such a way that upper side 174 faces first housing part 150 and housing base 15. First pressure channel 178 is designed in such a way that pressure sensor element 128 may be acted upon by a first pressure $p_1$ from underside 176, as is described in greater detail below. Second pressure channel 180 is designed in such a way that pressure sensor element 128 may be acted upon by a second pressure $p_2$ from upper side 174, as is described in greater detail below. First pressure channel 178 is essentially U-shaped having a bottom section 182 and two flank sections 184. Flank sections 184 are oriented perpendicular to bottom section 182. Flank sections 184 extend upwardly, referring to the depiction of FIG. 3. Flank sections 184 in this case run laterally adjacent to receptacle 160 and are delimited by walls 186. As a result, pressure sensor module 110 in an inserted state is located between flank sections 184, as is readily apparent in FIG. 4. Flank sections 184 in this case are formed laterally adjacent to pressure sensor module 110. Flank sections 184 are formed with a length such that, referring to the depiction of FIG. 4, they lead into a chamber 188 above pressure sensor module 110. As a result, a fluid medium may pass through first pressure feed 168 into first pressure channel 178 and more precisely from the side relative to housing 148, into bottom section 182. From bottom section 182, the fluid medium may pass into flank sections 184. From flank sections 184, the fluid medium may pass into chamber 188. Since pressure sensor module 110 is situated inverted in housing 148 as compared to the preceding exemplary embodiments, the fluid medium is able to pass out of chamber 188 through opening 124 in substrate 114 and through channel 126 in molding compound 116 to underside 176 of pressure sensor 128.

Second pressure channel 180 extends through between the two flank sections 184. Referring to the depiction of FIG. 3, second pressure channel 180 is structurally and spatially separated from first pressure channel 178. Referring to the depiction of FIG. 3, second pressure channel 180 extends above bottom section 182 of first pressure channel 178. Thus, second pressure channel 180 is formed in the housing space 164 and extends in a straight line into receptacle 160. Second pressure channel 180 in this case is formed as a recess 190 in receptacle 160. As a result, a fluid medium may pass through second pressure feed 169 into second pressure channel 180 and more precisely from the side, referring to the depiction of FIG. 3, initially into pressure chamber 164. From pressure chamber 164, the fluid medium may pass into second pressure channel 180. From pressure chamber 164, the fluid medium may pass into second pressure channel 180. Since pressure sensor module 110 is situated inverted in housing 148 as compared to the preceding exemplary embodiments, the fluid medium may pass from second pressure channel 180 to upper side 176 of pressure sensor element 128.

As is further apparent from FIG. 3, pressure chamber 164 is laterally delimited by walls 192. Circuit space 166 is also laterally delimited by walls 194. Walls 192 of pressure chamber 164 and walls 194 of circuit space 166 in this case are spaced apart from walls 186 of flank sections 184, in each case by a gap 196. Pressure chamber 164 may be sealed off from circuit space 166, for example, by sealing material 158 and/or by two webs 159 which, originating from housing cover 156, are placed, for example, onto sensor module 110 and are sealed off from sensor module 110 by sealing material 158. One web 159 engages in each case in one gap 196, respectively. Thus, with the aid of webs 159, sensor module 110 may be additionally mechanically fixed. At least one electrical component may be accommodated in circuit space 166. Sensor module 110 may be situated partially in pressure chamber 164 and partially in circuit space 166 and may be sealed off from housing 148. In the example depicted, for example, the at least one capacitor 138 may be situated in circuit space 166. In order to electrically contact the at least one strip conductor 140 after sensor module 110 has been inserted into first housing part 150, for example, into receptacle 160 and, for example, to electrically connect it to at least one electrical connector 170, strip conductor 140 may be connected to connector 170 with the aid of a bonding wire, not further shown, due to the inverted arrangement of sensor module 110 since, referring to the depiction of FIGS. 4 and 5, an access to strip conductor 140 from above is possible.

What is claimed is:

1. An apparatus for detecting a pressure of a fluid medium, the apparatus comprising:
    at least one housing with at least two pressure feed lines;
    at least one sensor module, the sensor module being received in the housing, wherein the sensor module includes:
        at least one carrier element having at least one substrate and at least one molding compound, the carrier element having at least one passage opening, the passage opening penetrating the carrier element completely; and
    at least one pressure sensor element for detecting the pressure and including at least one membrane, the pressure sensor element covering the passage opening, wherein:
        the sensor module includes at least one control and evaluation unit,
        the control and evaluation unit includes at least one application-specific integrated circuit and is enclosed at least partially by the molding compound,
        the housing includes at least one first housing part and at least one second housing part,
        the first housing part and the second housing part are connected to one another in an integrally joined manner,
        the pressure sensor element includes an upper side and a lower side,
        the membrane is situated on the upper side,
        the lower side faces the substrate,
        the sensor module is received in the housing in such a way that the upper side faces the first housing part,
        a first pressure duct and a second pressure duct are configured in the first housing part,
        the first pressure duct is connected to a first pressure feed line,
        the second pressure duct is connected to a second pressure feed line, the first pressure duct is configured in such a way that the pressure sensor element can be loaded from the lower side with a first pressure,
        the second pressure duct is configured in such a way that the pressure sensor element can be loaded from the upper side with a second pressure,
        the first pressure duct is of substantially U-shaped configuration with a bottom section and two limb sections, and
        the second pressure duct extends through between the two limb sections.

2. The device as recited in claim 1, wherein the molding compound is designed in such a way that at least part of a diaphragm of the pressure sensor element is not covered by the molding compound.

3. The device as recited in claim 1, wherein the pressure sensor element is covered entirely or partially with a first protective material, the first protective material being configured to provide a protection of the pressure sensor element from external influences.

4. The device as recited in claim 1, further comprising:
    at least one sealing material to connect the first housing part and the second housing part to one another and to connect the sensor module to the housing.

5. The device as recited in claim 4, wherein the housing includes at least one receptacle for accommodating the sensor module, the sensor module being affixed in the receptacle with the aid of the sealing material.

6. The device as recited in claim 1, wherein the housing encloses at least one pressure chamber and at least one circuit space, the pressure chamber being sealed off from the circuit space, and at least one electrical component being accommodated in the circuit space, the sensor module being situated partially in the pressure chamber and partially in the circuit space and being sealed off from the housing.

7. The device as recited in claim 1, further comprising:
    at least one electrical connector, the sensor module being electrically connected to the electrical connector by at least one electrically conductive adhesive.

8. The device as recited in claim 7, wherein the conductive adhesive is configured to form a direct electrical contact with the electrical connector.

* * * * *